(12) United States Patent
Song et al.

(10) Patent No.: US 12,489,445 B2
(45) Date of Patent: Dec. 2, 2025

(54) DRIVER CIRCUITRY WITH REDUCED INTERSYMBOL INTERFERENCE JITTER

(71) Applicant: XILINX, INC., San Jose, CA (US)

(72) Inventors: Wenyi Song, San Jose, CA (US); Shadi Barakat, Redwood City, CA (US)

(73) Assignee: XILINX, INC., San Jose, CA (US)

( * ) Notice: Subject to any disclaimer, the term of this patent is extended or adjusted under 35 U.S.C. 154(b) by 240 days.

(21) Appl. No.: 18/200,432

(22) Filed: May 22, 2023

(65) Prior Publication Data

US 2024/0396550 A1  Nov. 28, 2024

(51) Int. Cl.
*G11C 11/408* (2006.01)
*H03K 3/037* (2006.01)
*H03K 19/003* (2006.01)
*H03K 19/0185* (2006.01)

(52) U.S. Cl.
CPC .... *H03K 19/00361* (2013.01); *G11C 11/4082* (2013.01); *H03K 3/0375* (2013.01); *H03K 19/018521* (2013.01)

(58) Field of Classification Search
CPC ..... H03K 19/00361; H03K 19/018521; H03K 3/0375
See application file for complete search history.

(56) References Cited

U.S. PATENT DOCUMENTS

2019/0207687 A1\* 7/2019 Raj ................ H04B 17/18

\* cited by examiner

*Primary Examiner* — Alfredo Bermudez Lozada
(74) *Attorney, Agent, or Firm* — Patterson + Sheridan, LLP (57) ABSTRACT

Driver circuitry for memory controller circuitry includes level shifter circuitry, inverter circuitry, and output circuitry. The level shifter circuitry receives an input data signal and outputs a first level shifted data signal and a second level shifted data signal based on the input data signal. The inverter circuitry is connected to the level shifter circuitry, receives the first level shifted data signal and the second level shifted data signal, and outputs a first inverted data signal via a first output node and a second inverted data signal via a second output node. The inverter circuitry includes mitigation circuitry coupled to the first output node and the second output node and alters one or more of the first inverted data signal and the second inverted data signal. The output circuitry outputs an output data signal based on the first inverted data signal and the second inverted data signal.

20 Claims, 6 Drawing Sheets

DRIVER CIRCUITRY WITH REDUCED INTERSYMBOL INTERFERENCE JITTER

TECHNICAL FIELD

Examples of the present disclosure generally relate to driver circuitry of an integrated circuit that includes mitigation circuitry for mitigating intersymbol jitter in the output signal.

BACKGROUND

An integrated circuit (IC) device includes driver circuitry for outputting signals to a memory device. The driver circuitry may be referred to as an input/output driver. The driver circuitry includes multiple data paths that include level shifter circuitry, logic circuitry (e.g., including inverter or buffer circuitry), and output circuitry. In many implementations, the driver circuitry is designed for a specific memory type (e.g., protocol or standard). Accordingly, the driver circuitry can be designed to mitigate interference specifically tailored based on the memory type. In other implementations, the driver circuitry is designed to support multiple memory types. In such implementations, the driver circuitry is more susceptible to interference. Accordingly, to improve the performance of the driver circuitry, the design complexity of the driver circuitry is increased and the difficulty in mitigating interference within the output of driver circuitry is increased.

SUMMARY

In one example, driver circuitry includes level shifter circuitry, inverter circuitry, and output circuitry. The level shifter circuitry receives an input data signal and outputs a first level shifted data signal and a second level shifted data signal based on the input data signal. The inverter circuitry is connected to the level shifter circuitry, receives the first level shifted data signal and the second level shifted data signal, and outputs a first inverted data signal via a first output node and a second inverted data signal via a second output node. The inverter circuitry includes mitigation circuitry coupled to the first output node and the second output node and alters one or more of the first inverted data signal and the second inverted data signal. The output circuitry outputs an output data signal based on the first inverted data signal and the second inverted data signal.

The memory controller circuitry includes driver circuitry. The driver circuitry drives a memory device and includes level shifter circuitry, inverter circuitry, and output circuitry. The level shifter circuitry receives an input data signal and outputs a first level shifted data signal and a second level shifted data signal based on the input data signal. The inverter circuitry is connected to the level shifter circuitry, receives the first level shifted data signal and the second level shifted data signal, and outputs a first inverted data signal via a first output node and a second inverted data signal via a second output node. The inverter circuitry includes mitigation circuitry coupled to the first output node and the second output node and alters one or more of the first inverted data signal and the second inverted data signal. The output circuitry is connected to the memory device and outputs an output data signal to the memory device. The output data signal is based on the first inverted data signal and the second inverted data signal.

In one example, an integrated circuit device includes memory controller circuitry connected to a memory device. The memory controller includes driver circuitry to drive the memory device and includes level shifter circuitry, inverter circuitry, and output circuitry. The level shifter circuitry receives an input data signal and outputs a first level shifted data signal and a second level shifted data signal based on the input data signal. The inverter circuitry is connected to the level shifter circuitry, receives the first level shifted data signal and the second level shifted data signal, and outputs a first inverted data signal via a first output node and a second inverted data signal via a second output node. The inverter circuitry includes mitigation circuitry coupled to the first output node and the second output node and configured to alter one or more of the first inverted data signal and the second inverted data signal. The output circuitry is connected to the memory device and outputs an output data signal to the memory device. The output data signal is based on the first inverted data signal and the second inverted data signal.

BRIEF DESCRIPTION OF DRAWINGS

So that the manner in which the above-recited features can be understood in detail, a more particular description, briefly summarized above, may be had by reference to example implementations, some of which are illustrated in the appended drawings. It is to be noted, however, that the appended drawings illustrate only typical example implementations and are therefore not to be considered limiting of its scope.

To facilitate understanding, identical reference numerals have been used, where possible, to designate identical elements that are common to the figures. It is contemplated that elements of one example may be beneficially incorporated in other examples.

DETAILED DESCRIPTION

Various features are described hereinafter with reference to the figures. It should be noted that the figures may or may not be drawn to scale and that the elements of similar structures or functions are represented by like reference numerals throughout the figures. It should be noted that the figures are only intended to facilitate the description of the features. They are not intended as an exhaustive description of the features or as a limitation on the scope of the claims. In addition, an illustrated example need not have all the aspects or advantages shown. An aspect or an advantage described in conjunction with a particular example is not necessarily limited to that example and can be practiced in any other examples even if not so illustrated, or if not so explicitly described.

Integrated circuit (IC) devices include a driver circuitry or circuitries that communicate with a memory device by driving data signals onto the memory device. The driver circuitries are included within data path circuitries of the IC devices. The driver circuitries are input/output driver circuitries. In one example, an IC device is a programmable device (e.g., a field programmable gate array (FPGA) or the like) that supports multiple different memory types. For example, the driver circuitry of the IC device is designed to support multiple different memory types that operate at different operating voltages. Such IC devices include multi-standard driver circuitries.

The driver circuitry includes transistors in an advanced process node (e.g., a process node of 7 nm or less). Such transistors may be referred to as thin oxide transistors. However, as a thin oxide transistor is not able to be used to directly drive an output pin, a stacked logic is used on the data path. For example, the bias transistors are added to protect the data transistors within the driver circuitry. The bias transistors improve the reliability of the data transistors when operating at various different supply voltages above the thin oxide transistor reliability limit. However, the bias transistors of the thin stack inverters introduce intersymbol interference (ISI) jitter, reducing the performance of the corresponding driver circuitry. In driver circuitries that have an increased ISI jitter, data errors may be present within the output signal due to distortion due to one symbol within the data signal interfering with a subsequent symbol. ISI jitter occurs when symbols blur together within the data signal due to the spreading of the transition edges of the data signal.

The driver circuitry described herein includes mitigation circuitry that mitigates (e.g. reduces the effects of) ISI jitter. The mitigation circuitry is included within the thin-stack inverter circuitry of the driver circuitry. In one example, the mitigation circuitry includes a capacitor coupled between the output nodes of the thin stack inverter circuitry. In another example, the mitigation circuitry includes two transistor stacks, one coupled to each output node of the thin stack inverter circuitry. The capacitor and the transistor stacks reduce the effects of the parasitic capacitances at the output nodes, mitigating ISI jitter. Accordingly, the reliability of the driver circuitry described herein is increased with a better performance, allowing for an IC device to support multiple memory device standards.

Figure 1:
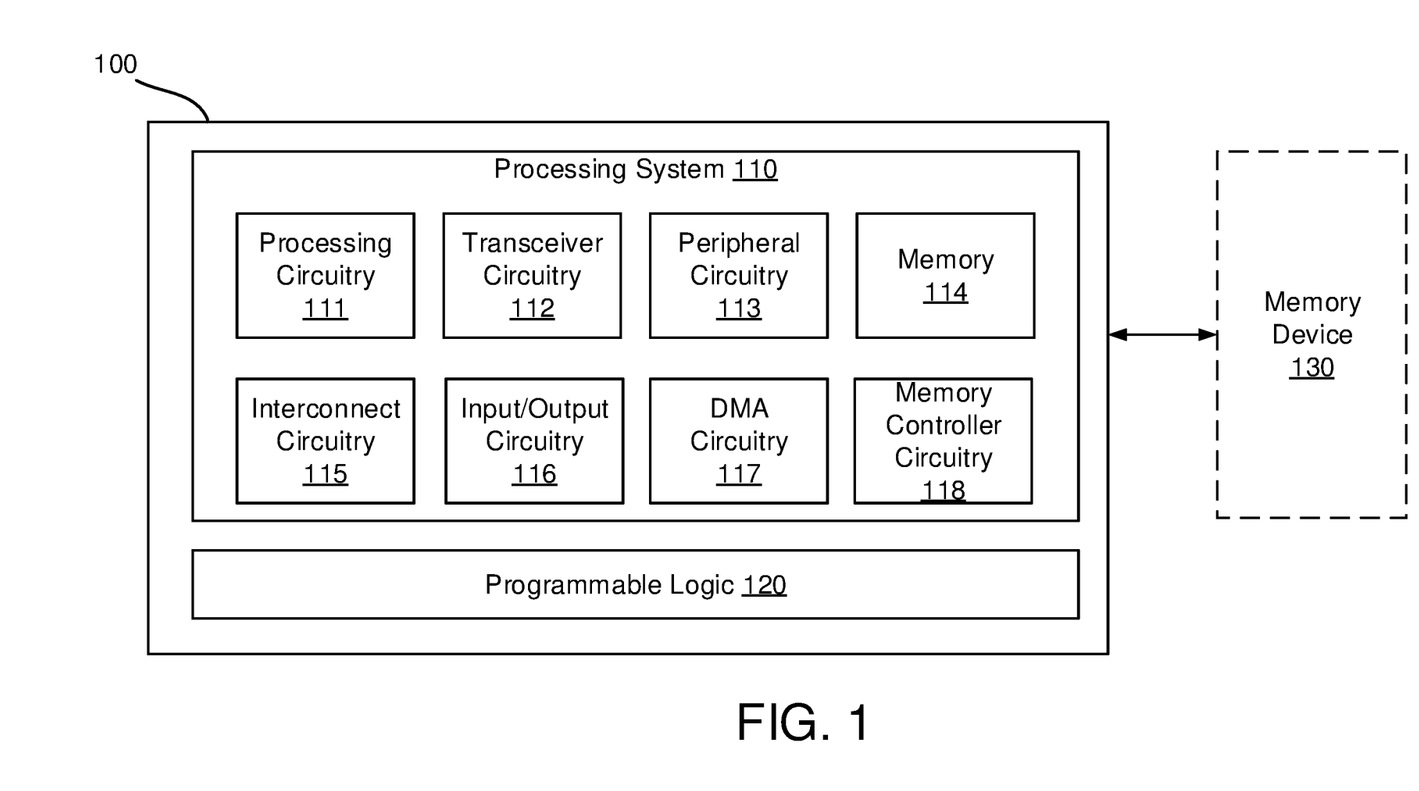
FIG. 1 illustrates a block diagram of an integrated circuit device.

FIG. 1 illustrates a block diagram of an IC device 100, according to one or more examples. The IC device 100 includes one or more IC chips. In one or more examples, the IC device 100 is an FPGA device (or another type of programmable IC device) or an application specific IC (ASIC), among others. The IC device 100 may be a system-on-chip (SoC). In one example, the IC device 100 is connected to the memory device 130. For example, the IC device 100 is connected to the memory device 130 via a channel that includes one or more wires that allow signals to be transferred between the IC device 100 and the memory device 130.

The memory device 130 is a dynamic random access memory (DRAM). In one example, the memory device 130 is a synchronous DRAM (SDRAM). In one or more examples, the memory device 130 is a double data rate SDRAM (DDR SDRAM). The DDR SDRAM may be a DDR1, DDR2, DDR3, DDR4, DDR5, or another type of DDR SDRAM. In other examples, the memory device 130 is a low-power DDR SDRAM (LPDDR SDRAM). The LPDDR SDARM may be a LPDDR1, LPDDR2, LPDDR3, LPDDR4, LPDDR5, or another type of LPDDR SDRAM. In other examples, other types of DDR SDRAM and LPDDR SDRAM may be used. Further, in yet other examples, other types of SDRAM and DRAM may be used.

The IC device 100 includes a processing system 110. The processing system 110 includes processing circuitry 111, transceiver circuitry 112, peripheral circuitry 113, memory 114, interconnect circuitry 115, input/output circuitry 116, DMA circuitry 117, and memory controller circuitry 118. In other examples, one or more of the above elements may be excluded from the IC device 100 and/or other elements may be included within the IC device 100.

The processing circuitry 111 includes one or more of real-time processing circuitry, application processing circuitry, graphics processing circuitry, configuration and security circuitry, and platform management circuitry, among others. The processing circuitry 111 includes one or more general processing devices (e.g., a central processing unit (CPU), among others), and associated circuitries (e.g., memories, interrupt controllers, memory access controllers, memory management controllers, and/or floating point units (FPUs), among others). The processing circuitry executes one or more functions (e.g., signal processing functions, memory management functions, and/or security management functions, among others) based on application and/or configuration data stored within an associated memory.

The transceiver circuitry 112 transmits and/or receives signals from a device external to the IC device. The peripheral circuitry 113 communicates with and/or controls the functionality of a peripheral device connected to the IC device 100. The memory 114 may be an on-chip memory (OCM). Further, the memory 114 is a RAM. The memory 114 is used by the processing circuitry 111, the transceiver circuitry 112, the peripheral circuitry 113, the input/output circuitry 116, the DMA circuitry 117, and the memory controller circuitry 118 to perform corresponding tasks. The interconnect circuitry 115 provides interconnections between two or more of the processing circuitry 111, the transceiver circuitry 112, the peripheral circuitry 113, the memory 114, the input/output circuitry 116, the direct memory access (DMA) circuitry, and the memory controller circuitry 118. The input/output circuitry 116 is coupled to one or more input/output pin, to output and/or receive signals to an external device connected to the pin or pins. In one example, the input/output circuitry 116 includes one or more multiplexers. The DMA circuitry 117 facilitates DMA operations between the processing circuitry 111 and the peripheral circuitry 113 or between other circuitries of the processing system 110.

The memory controller circuitry 118 controls the communication between the processing system 110 (and the IC device 100), and the memory device 130. In one example, the memory controller circuitry 118 is connected to one or more input/output pins of the IC device 100. The memory controller circuitry 118 outputs data signals to the memory device 130 and/or receives data signals from the memory device 130. The memory controller circuitry 118 includes one or more data path circuitries for communicating data signals to and from the memory device 130. The data path circuitries include output driver circuitry and are described in greater detail in the following.

The programmable logic 120 is connected to the processing system 110 via the interconnect circuitry 115. The programmable logic 120 includes programmable circuitry that have a functionality, which is adjusted (or changed) by loading configuration data into the programmable logic 120. The programmable logic 120 includes one or more transceivers, configurable logic blocks, random access memory blocks (BRAM), input/output circuitry, configuration and clocking circuitry, digital signal processing circuitry, specialized input/output circuitry, and/or other programmable logic.

In one or more examples, the IC device 100 supports multiple types of memory devices. For example, the memory controller circuitry 118 supports communication with multiple different types of memory devices. Accordingly, the IC device 100 (and the memory controller circuitry 118) is a multi-standard memory device.

Figure 2:
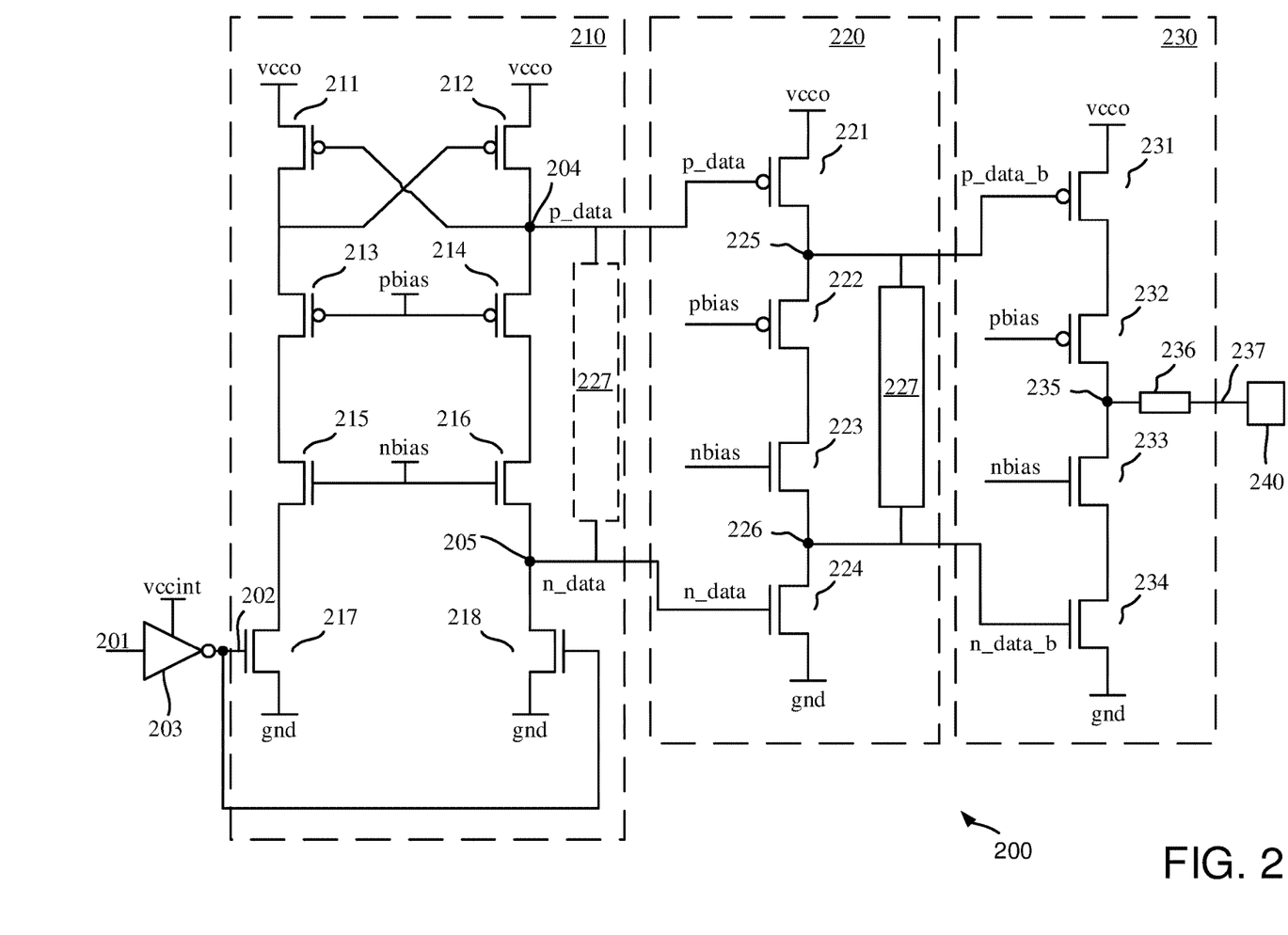
FIG. 2 illustrates a circuit diagram of driver circuitry.

FIG. 2 illustrates a circuit design of driver circuitry 200, according to one or more examples. The driver circuitry 200 is part of memory controller circuitry (e.g., the memory controller circuitry 118 of FIG. 1) of an IC device (e.g., the IC device 100 of FIG. 1). The driver circuitry 200 is input/output driver circuitry that is able to communicate signals (e.g., data and other types of signals) with a memory device (e.g., the memory device 130 of FIG. 1). The driver circuitry 200 is able to communicate with various different types of memory devices (e.g., memory devices that operate at different voltages). For example, the driver circuitry 200 supports communicating signals with DDR5 and LPDDR5 memory devices and/or among others.

The driver circuitry 200 includes level shifter circuitry 210, inverter circuitry 220, and output circuitry 230. The level shifter circuitry 210 receives an inverted data signal 202 and outputs the data signals p_data and n_data. The inverter circuitry 203 receives the data signal 201 and outputs the inverted data signal 202. The inverter circuitry 203 operates in a first power domain (e.g., vccint) different from a second power domain of the level shifter circuitry 210, the inverter circuitry 220, and the output circuitry 230 (e.g., vcco). The first power domain is a power domain of the corresponding IC device (e.g., the IC device 100 of FIG. 1). The voltage level of vccint is less than the voltage level of vcco. In one example, the voltage level of vccint is 0.5 V and the voltage level of vcco is 1.0 V or 1.2 V.

The level shifter circuitry 210 includes transistors 211-218. The transistors 211-214 are p-channel metal-oxide semiconductor (PMOS) transistors. The transistors 215-218 are n-channel MOS (NMOS) transistors. The source of the transistors 211 and 212 are connected to a node (e.g., voltage node) driven with the voltage signal vcco. The voltage level of vcco differs from that of vccint. For example, the voltage level of vcco is greater than that of vccint. The gates of the transistors 211 and 212 are cross-coupled. The drain of the transistor 211 is connected to the source of the transistor 213. The drain of the transistor 212 is connected to the source of the transistor 214. The gates of the transistors 213 and 214 are connected to a node (e.g., voltage node) that receives the voltage signal pbias. The voltage level of pbias is less than that of the vcco.

The drain of the transistor 213 is connected to the drain of the transistor 215. The drain of the transistor 214 is connected to the drain of the transistor 216. The gates of the transistors 215 and 216 are connected to a node that receives the voltage signal nbias. A voltage level nbias is greater than that of the gnd signal. The source of the transistor 215 is connected to the drain of the transistor 217. The source of the transistor 216 is connected to the drain of the transistor 218. The gates of the transistors 217 and 218 receive the inverted data signal 202. The sources of the transistors 217 and 218 are connected to a node (e.g., voltage node) that receives the ground voltage signal gnd.

The level shifter circuitry 210 outputs the p_data signal via the node 204 and the n_data signal via the node 205. The p_data and n_data signals are data signals and are generated based on the inverted data signals 202, the vcco signal, and the gnd signal.

The inverter circuitry 220 receives the p_data signal, the n_data signal, the pbias signal and the nbias signal, and outputs the p_data_b signal and n_data_b signal. The p_data_b signal is the inverted version of the p_data signal, and the n_data_b signal is the inverted version of the n_data signal. The inverter circuitry 220 includes transistors 221-224. The transistors 221 and 222 are PMOS transistors and the transistors 223 and 224 are NMOS transistors.

The source of the transistor 221 is connected to a node that receives the vcco signal, and the gate of the transistor 221 is connected to the node 204 and receives the p_data signal. The drain of the transistor 221 is connected to the node 225. The source of the transistor 222 is connected to the node 225, the gate of the transistor 222 is connected to a node that receives the pbias signal, and the drain of the transistor 222 is connected to the drain of the transistor 223. The gate of the transistor 223 is connected to a node that receives the nbias signal, and the source of the transistor 223 is connected to the node 226. The drain of the transistor 224 is connected to the node 226, the gate of the transistor 224 is connected to the node 205 and receives the n_data signal, and the source of the transistor 224 is connected to a node that receives the gnd signal. The signal p_data_b is output via the node 225 and the signal n_data_b is output via the node 226.

The inverter circuitry 220 is a thin stack inverter that includes two core PMOS transistors (e.g., transistors 221 and 222) in a stacked configuration and two core NMOS transistors (e.g., transistors 223 and 224) in a stacked configuration.

In one example, the voltage value of the nbias signal is set to mitigate electrical stress within the transistor 224. The voltage value of the pbias signal is set to mitigate electrical stress within the transistor 221. In one example, the pbias signal is set to be equal to difference between the voltage level of the vcco signal and the voltage level of the nbias signal (vcco-nbias). Such a relationship maintains rising edge transitions of the p_data signal the same as the falling edge transitions of the p_data_b signal.

The output circuitry 230 outputs the output data signal 237 based on the p_data_b signal, the pbias signal, the nbias signal, and the n_data_b signal. The output circuitry 230 includes transistors 231-234 and resistive element 236. The transistors 231-232 are PMOS transistors. The transistors 233-234 are NMOS transistors. In one example, the output circuitry 230 is a thin stack output circuitry.

The source of the transistor 231 is connected to a node that receives the vcco signal, and the gate of the transistor is connected to the node 225 and receives the p_data_b signal. The drain of the transistor 231 is connected to the source of the transistor 232, and a gate of the transistor 232 is connected to a node that receives the pbias signal. The drain of the transistor 232 is connected to the node 235. The drain of the transistor 233 is connected to the node 235, and the gate of the transistor 233 is connected to a node that receives the nbias signal. The source of the transistor 233 is connected to the drain of the transistor 234. The gate of the transistor 234 is connected to the node 226 and receives the n_data_b signal, and the source of the transistor 234 is connected to a node that receives the gnd signal.

The resistive element 236 is connected to the node 235 and the output pad 240. The resistive element 236 is a passive resistor. The output data signal 237 is output from the resistive element 236 to the output pad 240. The resistive element 236 increases the linearity of the output data signal 237. In one example, a first resistive element is connected to and outputs a signal form the drain of the transistor 231 and a second resistive element is connected to and outputs a signal from the drain of the transistor 234. Using a single resistive element (e.g., the resistive element 236) has a lower parasitic capacitance as compared to using two resistive elements.

The voltage levels of the nbias signal and the pbias signal are set to protect the transistors 221 and 223, mitigating errors within the output data signal 237. The nbias signal and the pbias signal limit the voltage swing of the n_data_b and p_data_b signals. As the n_data_b signal transitions from a low voltage level to a high voltage level (e.g., has a rising edge), the high voltage level depends on how long the voltage at the high voltage level is maintained. When the voltage level of the n_data_b signal is less than the difference between the voltage level of the nbias signal and the threshold voltage of the transistor 223 (nbias-vthn), the transistor 223 is turned on. When the voltage level of the n_data_b signal is greater than the difference between the voltage level of the nbias signal and the threshold voltage of the transistor 223 (e.g., nbias-vthn), the transistor 223 is turned off. When the transistor 223 is turned off, a small subthreshold current charges the parasitic capacitance at the node 226, increasing the amount of time (in the order of us) until the voltage at the node 226 is substantially constant (e.g., is substantially flat or is a substantially DC voltage). The subsequent falling edge of the n_data_b signal starts at a voltage level dependent on how long the voltage at the node 226 (e.g., the voltage of the n_data_b signal) maintains a voltage level at the high end of the voltage signal. A signal with a wider pulse (e.g., a greater time between rising and falling edges) will fall (e.g., transition to a low voltage) from a higher starting voltage level. The falling edge time constant is relatively constant. The falling edge time constant is a product of the n_data signal on resistance and the capacitance at the node 226. The amount of time for the voltage at the node 226 to drop to a crossing level depends on the corresponding starting voltage. In one example, the crossing level corresponds to a point where a rising edge crosses a corresponding falling edge. For example, a data sequence is fed through a data path first and the waveform is recorded a node of interest. The data sequence having an inverted polarity is fed through the same data path and the waveform is recorded at the node of interest. The two waveforms are overlapped with each other. At each transition edge, the first waveform will cross the second waveform at a point in time. The voltage level at the point in time is the crossing level. The higher the starting voltage, the more time is needed to drop to the crossing level. For a data signal having a sequence of pulses of varying high pulse widths (varying widths between rising and falling edges), the falling edges correspondingly take varying time to reach the crossing level. The range of the crossings in time is the resulting timing uncertainty.

In one example, the data signal 201 includes a sequence of symbols. A symbol corresponds to the pulse width (e.g., the difference in time between a rising and falling edge of the data signal 201. The current symbol delay depends on the width of a previous symbol, the timing uncertainty generates inter-symbol interference (e.g., interference between the symbols).

The transistors 211-218, 221-224, and 231-234 may be sized for high bandwidth applications. However, sizing the transistors for high bandwidth applications may lead to increased ISI jitter, limiting the performance of the driver circuitry 200. The ISI jitter may increase when the data signal 201 is a bursty data signal (e.g., includes many symbols with long 'quiet' time intervals in between). In one example, data is transmitted for a period of time and then not transmitted for a period of time (e.g., data transmission occurs in a stop-and-go fashion). During data transmission, there is a time period of continuous data transmission followed by a time period were data is not transferred. The time period during which data is transferred is called a data burst. Bursty data describes a data signal with multiple such data bursts. The data bursts begin after a substantially constant voltage is reached (e.g., a direct current (DC) voltage). The first one or more data pulses exhibit a longer amount of time to reach the crossing level.

In one example, to mitigate ISI jitter (e.g., ISI interference), the inverter circuitry 220 includes mitigation circuitry 227. Additionally, or alternatively, the mitigation circuitry 227 is connected to the outputs of the level shifter circuitry 210. The mitigation circuitry 227 alters current within the p_data_b signal and/or the n_data_b signal to mitigate ISI interference within the output data signal. In one example, the mitigation circuitry 227 is a capacitor that is connected between the nodes 225 and 226. The capacitor allows for instantaneous current to flow between the nodes 225 and 226. Accordingly, the p_data_b signal is the same as the n_data_b signal for a period of time (e.g., an instant), mitigating ISI jitter within the output data signal 237. Further, the capacitor forms a high pass filter that compensates for the high frequency component in the p_data_b and n_data_b signals, mitigating ISI jitter within the output data signal 237. In another example, the mitigation circuitry 227 includes a first transistor stack connected between a node driven with vcco and the node 225 and a second transistor stack connected between a node driven with the gnd signal and the node 226. The transistor stacks reduce charging/discharging current thru the parasitic capacitor 321 and 322, mitigating ISI interference within the output data signal 237.

In one example, the driver circuitry (e.g., the driver circuitry 200 of FIG. 2) has multiple leg circuitries. The leg circuitries are binary weighted based on the corresponding contribution to the output drive strength. In one example, the two most significant bits include the mitigation circuitry 227. Further, the mitigation circuitry 227 may be applied to pre-driver circuitries within the memory controller circuitry 118, and/or other circuitries.

Figure 3:
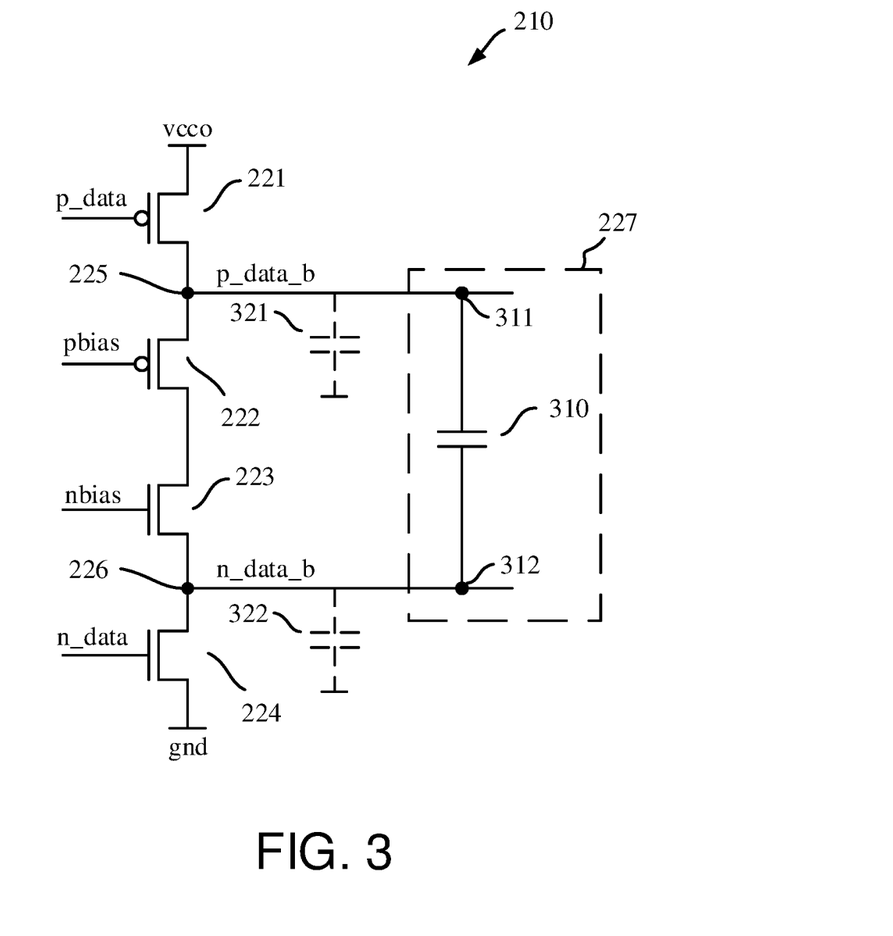
FIG. 3 illustrates a circuit diagram of inverter circuitry including mitigation circuitry.

FIG. 3 illustrates an example circuit diagram of the inverter circuitry 220, according to one or more examples. As illustrated in FIG. 3, the mitigation circuitry 227 includes the capacitor 310. The capacitor 310 is connected between nodes 311 and 312 (e.g., between nodes 225 and 226). As is noted above, the capacitor 310 provides an instantaneous current between nodes 311 and 312, such that the p_data_b signal is equal to the n_data_b signal when the p_data signal has voltage transitions (e.g., a rising edge or a falling edge). Further, the capacitor 310 forms a high-pass filter, compensating for the high-frequency component within the data signal 201. Accordingly, ISI jitter is mitigated within the corresponding output data signal.

The nodes 225 and 226 each have a respective parasitic capacitance, e.g., parasitic capacitances 321 and 322. The capacitor 310 has a capacitance value that is greater than that of the parasitic capacitance 321 and 322. In one example, the capacitance value of the capacitor 310 is about eight times greater than the capacitance value of the parasitic capacitance 321 and the capacitance value of the parasitic capacitance 322. In one example, the capacitance value of the capacitor 310 is selected to be greater than the capacitance value of the parasitic capacitance 321 and the capacitance value of the parasitic capacitance 322, and to mitigate ISI jitter within the p_data_b signal and the n_data_b signal. In such an example, the capacitance value of the capacitor 310 is N times greater than the capacitance value of the parasitic capacitance 321 and the capacitance value of the parasitic capacitance 322. N is greater than one.

In one or more examples, the mitigation circuitry 227 including the capacitor 310 may be disposed between the outputs of the level shifter circuitry 210 of FIG. 2.

Figure 4:
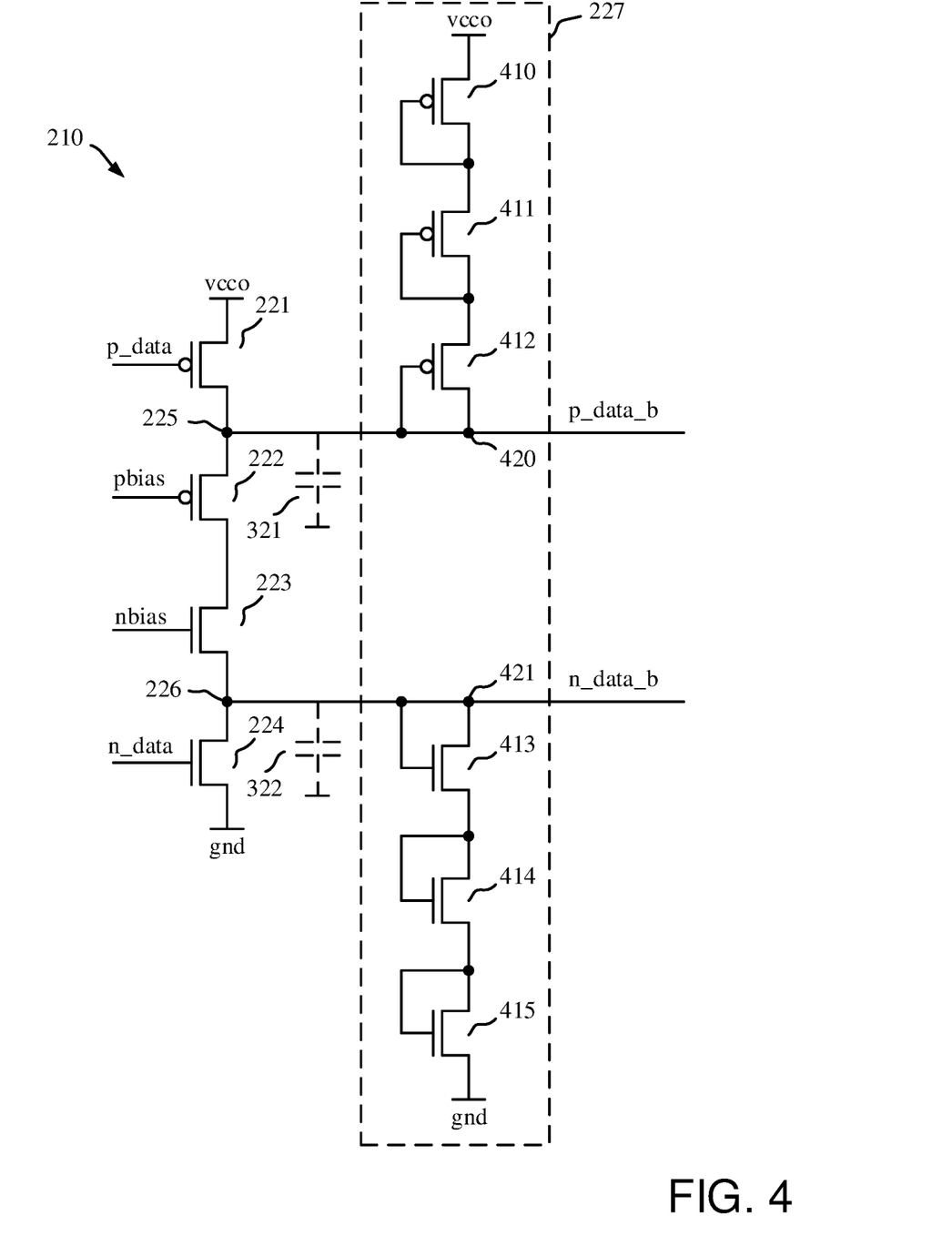
FIG. 4 illustrates a circuit diagram of inverter circuitry including mitigation circuitry.

FIG. 4 illustrates an example circuit diagram of the inverter circuitry 220, according to one or more examples. As illustrated in FIG. 4, the mitigation circuitry 227 includes the transistors 410-415. The transistors 410-412 are connected between a node that receives the voltage signal vcco and the node 420 (e.g., the node 225). The transistors 411-414 are connected between the node 421 (e.g., the node 226) and a node that receives the gnd signal.

The transistors 410-412 are PMOS transistors. Each of the transistor are 410-412 are diode connected (e.g., have a gate connected to a drain). The source of the transistor 410 is connected to a node that receives the voltage signal vcco. The gate of the transistor 410 is connected to the drain of the transistor 410 and to the source of the transistor 411. The gate of the transistor 411 is connected to the drain of the transistor 411 and to the source of the transistor 412. The gate of the transistor 412 is connected to the drain of the transistor 412 and to the node 420 (e.g., the node 225).

The transistors 413-415 are NMOS transistors. Each of the transistor are 413-415 are diode connected (e.g., have a gate connected to a drain). The source of the transistor 415 is connected to a node that receives the gnd signal. The gate of the transistor 415 is connected to the drain of the transistor 414 and to the source of the transistor 414. The gate of the transistor 414 is connected to the drain of the transistor 414 and to the source of the transistor 413. The gate of the transistor 413 is connected to the drain of the transistor 412 and to the node 421 (e.g., the node 226).

The transistors 410-415 provide analog mitigation of the ISI jitter. The turn on voltage for the transistors 413-415 is selected based on the difference between the voltage value of the nbias signal and the threshold voltage of the transistors 223 and 224 (e.g., vthn) or nbias-vthn. In one example, the turn on voltage for the transistors 413-415 is selected to be about the same as nbias-vthn. The turn on voltage for the transistors 410-412 is selected based on the difference between the voltage value of the vcco signal, the voltage value of the pbias signal and the threshold voltage of the transistors 221 and 222 (e.g., vthp) or vcco−pbias−vthp. The turn on voltage for the transistors 410-412 is selected to be about the same as vcco-pbias-vthp.

In one example at a rising edge of the data signal 201, as the voltage value of the n_data_b signal rises above nbias-vthn, the subthreshold current of the transistors 223 and 224 travels through transistors 413-415 instead of charging the parasitic capacitance 322. Accordingly, the voltage increase on the n_data_b signal is small, such that at the subsequent falling edge the starting voltage level is similar whether the data signal 201 has a high voltage level for a long or short duration. Further, for the p_data_b signal, the slow discharging current to the parasitic capacitance 321 is bypassed to the transistors 410-412. Accordingly, the voltage level of the p_data_b signal has a small amount of voltage variation regardless of the duration that the data signal 201 has a low voltage level. Accordingly, ISI jitter is mitigated, improving the performance of the corresponding driver circuitry (e.g., the driver circuitry 200 of FIG. 2).

In one or more examples, the mitigation circuitry 227 including the transistors 410-415 may be connected to the outputs of the level shifter circuitry 210 of FIG. 2.

Figure 5:
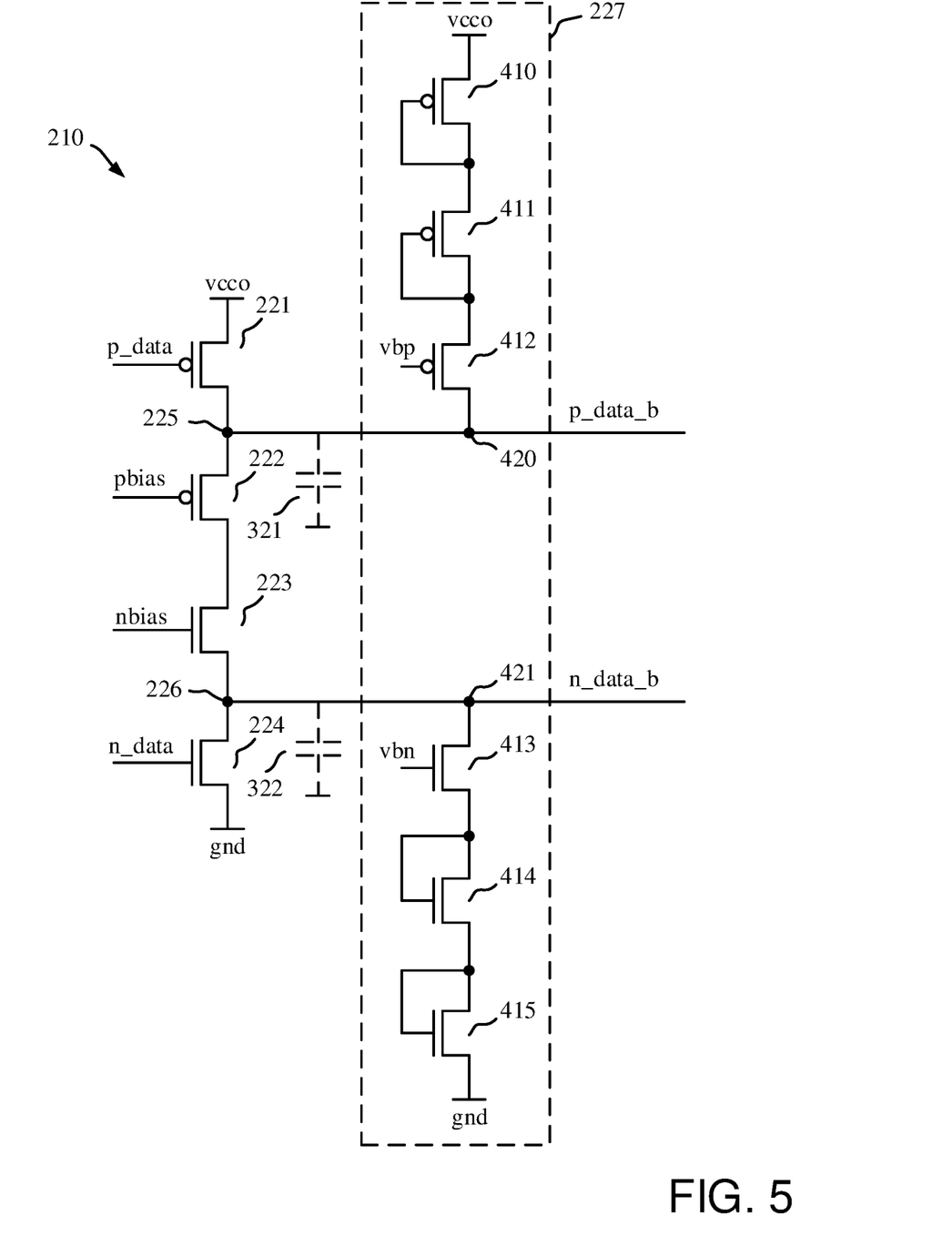
FIG. 5 illustrates a circuit diagram of inverter circuitry including mitigation circuitry that can be enabled or disabled.

FIG. 5 illustrates an example circuit diagram of the inverter circuitry 220, according to one or more examples. The mitigation circuitry 227 includes the transistors 410-415 as is described above with regard to FIG. 4. However, as compared to the transistors 410-415 of FIG. 5, the gate of transistor 412 is connected to a node that receives the vbp signal and gate of the transistor 413 is connected to a node that receives the vbn signal. Accordingly, by varying the voltage value of the vbp signal and the von signal, the mitigation circuitry 227 can be turned on and off, reducing the power requirements of the corresponding driver circuitry (e.g., the driver circuitry 200 of FIG. 2). With reference to FIG. 1, the mitigation circuitry 227 is turned off when the relative impact for ISI interference is reduced (or lower) due to the operating frequency of the memory device 130 being reduced. The mitigation circuitry 227 is turned on when the relative impact for ISI interference is increased (or higher) due to the operating frequency of the memory device 130 being increased.

In one or more examples, the mitigation circuitry 227 illustrated in FIG. 5 may be connected to the outputs of the level shifter circuitry 210 of FIG. 2.

Figure 6:
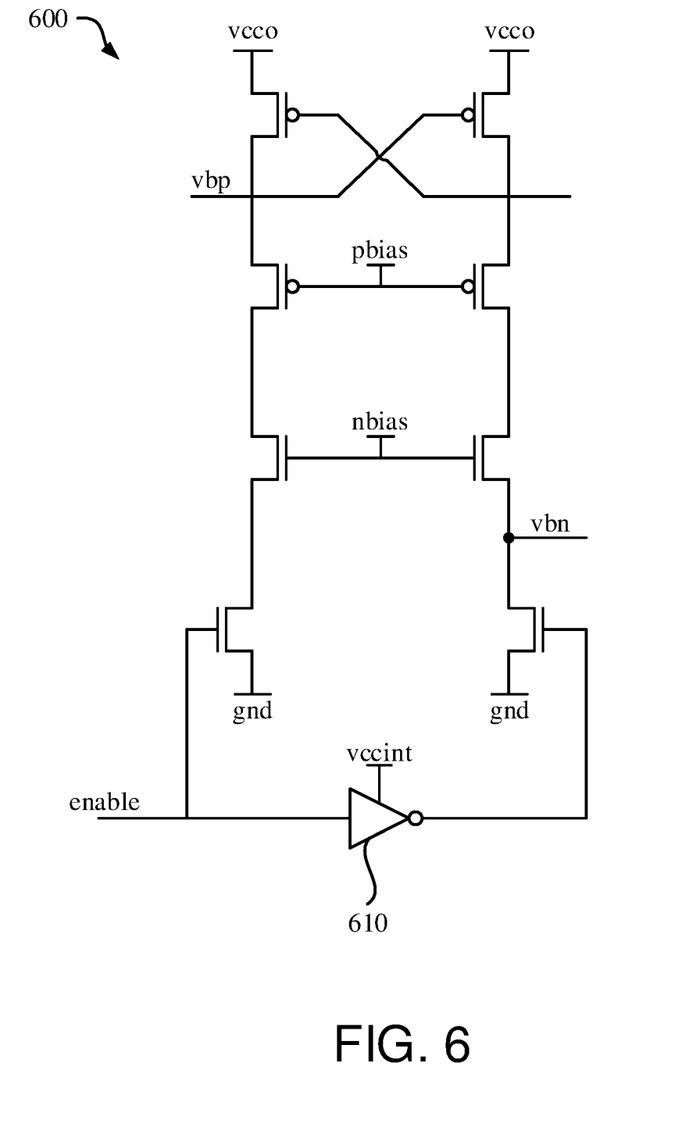
FIG. 6 illustrates a circuit diagram of inverter circuitry.

FIG. 6 illustrates the level shifter 600. The level shifter 600 generates the vbp and vbn signals of FIG. 5. For example, the level shifter 600 is driven by the inverter 610 that receives the enable signal. The enable signal enables or disables the level shifter 600. In one example, based on the output of the inverter 610 being the vccint signal (e.g., a value of one), the vbp and vbn signals enable the transistors 410-412 and 413-415. When the output of the inverter 610 has a voltage value of zero, the vbp and vbn signals disenable the transistors 410-412 and 413-415, reducing the corresponding power consumption.

While the foregoing is directed to specific examples, other and further examples may be devised without departing from the basic scope thereof, and the scope thereof is determined by the claims that follow.

What is claimed is:

1. A driver circuitry comprising:
  level shifter circuitry comprising a first output node and a second output node and configured to receive an input data signal and output a first level shifted data signal via the first output node and a second level shifted data signal via the second output node based on the input data signal;
  inverter circuitry connected to the first output node and the second output node of the level shifter circuitry, comprising a third output node and a fourth output node, and configured to:
    receive the first level shifted data signal and the second level shifted data signal via the first output node and the second output node; and
    output a first inverted data signal via the third output node and a second inverted data signal via the fourth output node, wherein the inverter circuitry includes mitigation circuitry coupled to and between the third output node and the fourth output node and configured to alter one or more of the first inverted data signal and the second inverted data signal; and
  output circuitry comprising a first input node coupled to the third output node and a second input node coupled the fourth output node and configured to receive the first inverted data signal via the third output node and the second inverted data signal via the fourth output node, and output an output data signal based on the first inverted data signal and the second inverted data signal.

2. The driver circuitry of claim 1, wherein the mitigation circuitry includes first transistors connected between a first voltage node and the third output node and second transistors connected between a second voltage node and the fourth output node.

3. The driver circuitry of claim 2, wherein the first transistors comprise a first diode connected transistor and the second transistors comprise a second diode connected transistor.

4. The driver circuitry of claim 3, wherein the first transistors and the second transistors are configured to be disabled based on an enable signal, disabling the mitigation circuitry.

5. The driver circuitry of claim 2, wherein the first transistors are p-channel metal-oxide semiconductor (PMOS) transistors and the second transistors are n-channel MOS (NMOS) transistors.

6. The driver circuitry of claim 1, wherein the mitigation circuitry includes a capacitor connected between the third output node and the fourth output node.

7. The driver circuitry of claim 1, wherein the inverter circuitry includes a first PMOS transistor and a second PMOS transistor connected to the third output node, and a first NMOS transistor and a second NMOS transistor connected to the fourth output node.

8. A memory controller circuitry comprising:
driver circuitry configured to drive a memory device, the driver circuitry comprising:
  level shifter circuitry comprising a first output node and a second output node and configured to receive an input data signal and output a first level shifted data signal via the first output node and a second level shifted data signal via the second output node based on the input data signal;
  inverter circuitry connected to the first output node and the second output node of the level shifter circuitry, comprising a third output node and a fourth output node, and configured to:
    receive the first level shifted data signal and the second level shifted data signal via the first output node and the second output node; and
    output a first inverted data signal via the third output node and a second inverted data signal via the fourth output node, wherein the inverter circuitry includes mitigation circuitry coupled to and between the third output node and the fourth output node and configured to alter one or more of the first inverted data signal and the second inverted data signal; and
  output circuitry comprising a first input node coupled to the third output node and a second input node coupled the fourth output node and configured to be connected to the memory device, receive the first inverted data signal via the third output node and the second inverted data signal via the fourth output node, and output an output data signal to the memory device, wherein the output data signal is based on the first inverted data signal and the second inverted data signal.

9. The memory controller circuitry of claim 8, wherein the mitigation circuitry includes first transistors connected between a first voltage node and the third output node and second transistors connected between a second voltage node and the fourth output node.

10. The memory controller circuitry of claim 9, wherein the first transistors comprise a first diode connected transistor and the second transistors comprise a second diode connected transistor.

11. The memory controller circuitry of claim 10, wherein the first transistors and the second transistors are configured to be disabled based on an enable signal, disabling the mitigation circuitry.

12. The memory controller circuitry of claim 9, wherein the first transistors are p-channel metal-oxide semiconductor (PMOS) transistors and the second transistors are n-channel MOS (NMOS) transistors.

13. The memory controller circuitry of claim 8, wherein the mitigation circuitry includes a capacitor connected between the third output node and the fourth output node.

14. The memory controller circuitry of claim 8, wherein the inverter circuitry includes a first PMOS transistor and a second PMOS transistor connected to third first output node, and a first NMOS transistor and a second NMOS transistor connected to the fourth output node.

15. An integrated circuit device comprising:
memory controller circuitry configured to connected to a memory device, the memory controller circuitry comprising:
  driver circuitry configured to drive the memory device, the driver circuitry comprising:
    level shifter circuitry comprising a first output node and a second output node and configured to receive an input data signal and output a first level shifted data signal via the first output node and a second level shifted data signal via the second output node based on the input data signal;
    inverter circuitry connected to the first output node and the second output node of the level shifter circuitry, comprising a third output node and a fourth output node, and configured to:
      receive the first level shifted data signal and the second level shifted data signal via the first output node and the second output node; and
      output a first inverted data signal via the third first output node and a second inverted data signal via the fourth output node, wherein the inverter circuitry includes mitigation circuitry coupled to and between the third output node and the fourth output node and configured to alter one or more of the first inverted data signal and the second inverted data signal; and
    output circuitry comprising a first input node coupled to the third output node and a second input node coupled the fourth output node and configured to be connected to the memory device, receive the first inverted data signal via the third output node and the second inverted data signal via the fourth output node, and output an output data signal to the memory device, wherein the output data signal is based on the first inverted data signal and the second inverted data signal.

16. The integrated circuit device of claim 15, wherein the mitigation circuitry includes first transistors connected between a first voltage node and the third output node and second transistors connected between a second voltage node and the fourth output node.

17. The integrated circuit device of claim 16, wherein the first transistors comprise a first diode connected transistor and the second transistors comprise a second diode connected transistor.

18. The integrated circuit device of claim 16, wherein the first transistors are p-channel metal-oxide semiconductor (PMOS) transistors and the second transistors are n-channel MOS (NMOS) transistors.

19. The integrated circuit device of claim 15, wherein the mitigation circuitry includes a capacitor connected between the third output node and the fourth output node.

20. The integrated circuit device of claim 15, wherein the integrated circuit device is a programmable integrated circuit device.

* * * * *